(12) United States Patent
Shin et al.

(10) Patent No.: US 6,924,530 B2
(45) Date of Patent: Aug. 2, 2005

(54) DOUBLE DIFFUSED MOS TRANSISTOR AND METHOD FOR MANUFACTURING SAME

(75) Inventors: Hwa-Sook Shin, Suwon (JP); Soo-Cheol Lee, Yongin (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/888,913

(22) Filed: Jul. 12, 2004

(65) Prior Publication Data

US 2004/0248370 A1 Dec. 9, 2004

Related U.S. Application Data

(62) Division of application No. 10/377,806, filed on Mar. 4, 2003, now Pat. No. 6,773,995.

(30) Foreign Application Priority Data

Jul. 24, 2002 (KR) .................................... 2002-0043697

(51) Int. Cl.$^7$ .............................................. H01L 29/76
(52) U.S. Cl. ..................... 257/335; 257/339; 257/341; 257/365
(58) Field of Search ................................ 257/332, 335, 257/339–401, 409, 491, 500–2, 343, 473

(56) References Cited

U.S. PATENT DOCUMENTS

| 5,682,048 A | | 10/1997 | Shinohara et al. |
| 5,882,966 A | * | 3/1999 | Jang ........................... 438/234 |
| 6,194,761 B1 | | 2/2001 | Chiozzi et al. |
| 6,472,709 B1 | * | 10/2002 | Blanchard .................... 257/343 |

\* cited by examiner

*Primary Examiner*—Long Pham
*Assistant Examiner*—Wai-Sing Louie
(74) *Attorney, Agent, or Firm*—Harness Dickey & Pierce

(57) ABSTRACT

A method of manufacturing a semiconductor device, such as a double-diffused metal oxide semiconductor (DMOS) transistor, where a first layer may be formed on a semiconductor substrate, with isolation trenches formed in the first layer and semiconductor substrate, and with the trenches being filled with an isolation layer. A second layer may be formed on the first layer and semiconductor substrate, and a plurality of drain trenches may be formed therein. A pair of plug-type drains may be formed in the trenches, to be separated from the isolation layer by a dielectric spacer. Gates and source areas may be formed on a resultant structure containing the plug-type drains. Accordingly, current may be increased with a reduction in drain-source on resistance, and an area of the isolation layer can be reduced, as compared to an existing isolation layer, potentially resulting in a reduction in chip area.

10 Claims, 4 Drawing Sheets

DOUBLE DIFFUSED MOS TRANSISTOR AND METHOD FOR MANUFACTURING SAME

CROSS-REFERENCE TO RELATED CASES

This application claims the priority of Korean Patent Application No. 2002-0043697, filed Jul. 24, 2002, in the Korean Intellectual Property Office, the disclosure of which is incorporated herein in its entirety by reference. This application is a divisional application of and claims priority under 35 U.S.C. §120 to, co-pending U.S. patent application Ser. No. 10/377,806, filed Mar. 4, 2003 now U.S. Pat. No. 6,773,995.

BACKGROUND OF THE INVENTION

1. Field of the Invention

The present invention relates to a power device and a method for manufacturing the same.

2. Description of the Related Art

Double-diffused metal oxide semiconductor (DMOS) transistors, which are MOS-type transistors driven by voltage and which may bear high current, have begun attracting greater attention. DMOS transistors integrated with bipolar-type integrated circuits may be classified as lateral DMOS (LDMOS) transistors, or vertical DMOS (VDMOS) transistors, depending on the direction of current flowing therein. In particular, for DMOS transistors operating at a high voltage, it is advantageous that the DMOS transistors be VDMOS transistors because VDMOS transistors occupy smaller area on a substrate than LDMOS transistors. Among VDMOS transistors, N-channel VDMOS transistors, which have sound electrical characteristics, are typically used in bipolar-type integrated circuits.

N-channel VDMOS transistors are connected to N+ buried layers, using the N+ buried layers as drains. The drains may be heavily doped with impurity ions, thus isolation layers with considerable surface areas are required in order to isolate VDMOS transistors from each other. In a case where doping concentration is increased and drive-in time (e.g., time necessary to drive dopant atoms deeper into a semiconductor wafer of the device) long, a large-sized semiconductor device with a wider isolation layer may be required in order to reduce a drain-source on-resistance (Rdson), so as to maintain breakdown voltage of the semiconductor device. Where high-dose ion implantation is used for reducing Rdson, a thermal process requiring a sufficient amount of heat may be needed to diffuse impurity ions into a lower portion of the semiconductor device.

Due to the increased heat required, the area of the semiconductor device may increase in a horizontal direction during the diffusion. Additionally where high-energy ion implantation is used to reduce Rdson, since high-dose doping may be difficult, high-energy ion implantation techniques may be limited when reducing Rdson, since these techniques cannot avoid the diffusion of impurity ions in a vertical direction. Thus, high-energy ion implantation techniques may be disadvantageous to the scaling of the semiconductor device. As a result, a trade-off may exist between a desire to reduce Rdson, and a desire to reduce an area of an isolation layer.

However, the need for mounting small-sized, highly-integrated semiconductor devices that consume a small amount of power on a semiconductor chip continues to increase. Thus, a technique for achieving appropriate performance from semiconductor devices by reducing Rdson and scaling down the semiconductor devices along horizontal and vertical dimensions is desired.

SUMMARY OF THE INVENTION

Exemplary embodiments of the present invention provide a method for manufacturing a semiconductor device, such as a DMOS transistor, for example, by which Rdson and the size of a semiconductor chip containing the device may be reduced. Exemplary embodiments of the present invention also may provide a DMOS transistor which has a small Rdson, which may be advantageous in the integration of a semiconductor device.

In an exemplary embodiment, the present invention is directed to a method of forming a semiconductor device, where a first layer may be formed on a semiconductor substrate, and one or more isolation trenches may be formed and filled with an isolation layer. A second layer may be formed on the first layer and semiconductor substrate, and a plurality of drain trenches may be formed therein. A pair of plug-type drains may be formed in the trenches, to be separated from the isolation layer by a dielectric spacer. Gates and source areas may be formed on a resultant structure containing the plug-type drains. Accordingly, current may be increased with a reduction in drain-source on resistance, and an area of the isolation layer can be efficiently reduced, as compared to an existing isolation layer, potentially resulting in a reduction in chip area.

According to a further exemplary embodiment, the present invention is directed to a method of manufacturing a double-diffused metal oxide semiconductor (DMOS) transistor. A buried layer containing impurity ions of a second conductivity type may be formed in a semiconductor substrate containing impurity ions of a first conductivity type. Isolation trenches may be formed in the buried layer and semiconductor substrate, and an isolation layer may be formed in the isolation trenches. An epitaxial layer containing impurity ions of the second conductivity type may be grown on the buried layer and isolation layer, and drain trenches may be formed in isolation layer. A dielectric spacer may be formed on sidewalls of the drain trenches, and plug-type drains containing impurity ions of the second conductivity type may be formed on the dielectric spacer within the drain trenches. Gates and source areas may be formed on a resultant structure containing the plug-type drains.

According to another exemplary embodiment, the present invention is directed to a double-diffused metal oxide semiconductor transistor that may include a semiconductor substrate, a buried layer, an isolation layer, an epitaxial layer, plug-type drains, a dielectric spacer, body areas, source areas, and gate oxide layers and gates. The semiconductor substrate may include impurity ions of a first conductivity type. The buried layer may be formed on the semiconductor substrate and include impurity ions of a second conductivity type, different from the first conductivity type. The isolation layer may be formed in the buried layer and semiconductor substrate. The epitaxial layer may be formed on the isolation layer and buried layer and may include impurity ions of the second conductivity type. The plug-type drains may be formed in the epitaxial layer and may include impurity ions of the second conductivity type. The dielectric spacer may be formed on outer sidewalls of the plug-type drains adjacent to the isolation layer. The body areas may be formed in the epitaxial layer and include impurity ions of the first conductivity type. The source areas may be formed in the body areas and include impurity ions of the second conductivity type, and the gate oxide layers and gates may be formed on the source areas.

BRIEF DESCRIPTION OF THE DRAWINGS

Exemplary embodiments of the present invention will become more fully understood from the detailed description given hereinbelow and the accompanying drawings, wherein like elements are represented by like reference numerals, which are given by way of illustration only and thus are not limitative of the present invention and wherein.

DETAILED DESCRIPTION OF EXEMPLARY EMBODIMENTS

Figure 1:
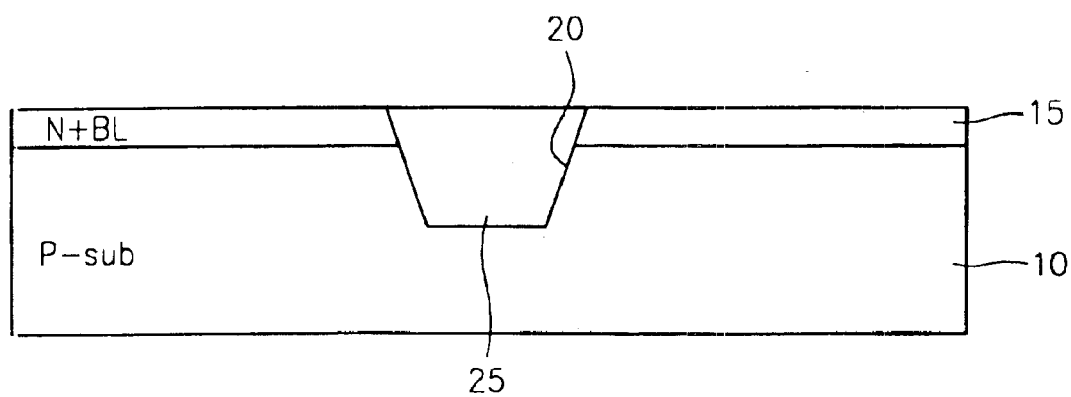
FIGS. 1 through 6 are cross-sectional views describing a method of manufacturing a VDMOS transistor according to an exemplary embodiment of the present invention.

Hereinafter, exemplary embodiments of the present invention will be described in detail with reference to the attached drawings. However, the exemplary embodiments of the present invention can be modified into various other forms, and the scope of the present invention must not be interpreted as being restricted to the exemplary embodiments. The exemplary embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

FIGS. 1 through 6 are cross-sectional views describing a method of manufacturing a VDMOS transistor according to an exemplary embodiment of the present invention. First, referring to FIG. 1, a semiconductor substrate (P-sub) 10, such as a P-type single crystal silicon substrate, may be prepared. For example, a two-step diffusion sequence may be used to form active p-n junctions in single crystal silicon wafers by distributing controlled amounts of electronically active diffusants, or "dopants." The starting wafer, such as semiconductor substrate 10, may initially contain a substantially uniform concentration of dopant. In the first step, called "pre-deposition diffusion," a controlled amount of the dopant may be introduced into the semiconductor substrate 10 near a free surface. In the second step, called "drive-in diffusion," the initially pre-deposited source of dopant may be diffused much more deeply into the semiconductor.

Thus, to prepare semiconductor substrate 10, N-type impurity ions may be implanted at a concentration of about $10^{19}$ ions/cm$^3$ into semiconductor substrate 10. The drive-in diffusion step may then be performed to diffuse the implanted impurity ions. A N+ buried layer (N+ BL) 15 may be formed on the semiconductor substrate 10 once the drive-in diffusion step is completed.

The N+ buried layer 15 and the semiconductor substrate 10 may then be etched to form an isolation trench 20. The isolation trench 20 may be filled with an insulating layer to form an isolation layer 25. The insulating layer may be comprised of an oxide or undoped silicon, for example.

The isolation layer 25 may be formed as follows. For example, a pad oxide layer (not shown) and a pad nitride layer (not shown) may be formed on the buried layer 15 and patterned to make an opening for forming the isolation trench 20. The buried layer 15 and semiconductor substrate 10 may be etched using the patterned pad oxide layer and patterned pad nitride layer as masks, forming the isolation trench 20 to a depth of several thousands Å, e.g., several micrometers ($\mu$m), for example.

Thereafter, the isolation trench 20 may be filled with oxide or undoped polysilicon. The oxide may be an oxide (e.g., middle temperature oxide (MTO)) formed by using a low pressure chemical vapor deposition (LPCVD) process such as a middle temperature oxide process, or an oxide formed using a high-density plasma chemical vapor deposition (HDP-CVD) process, for example, or other known deposition processes. The undoped polysilicon may be deposited at a temperature of 500° C.–700° C. using LPCVD or other known deposition processes, for example. Also, before the oxide or the undoped polysilicon is deposited, a thermal oxide may be formed on an inner wall of the isolation trench 20, so as to stabilize an etch interface between the isolation trench 20 and the buried layer 15, and/or between the isolation trench 20 and the semiconductor substrate 10. An upper surface of the resultant structure may be planarized using chemical mechanical polishing (CMP) or etch back. During CMP or etch back, the patterned pad nitride layer may operate as a stopper. The pad nitride layer and the pad oxide layer remaining on the buried layer 15 may then be removed to form an isolation layer 25 that may be slightly higher than or substantially parallel to the surface of the buried layer 15, for example.

Figure 2:
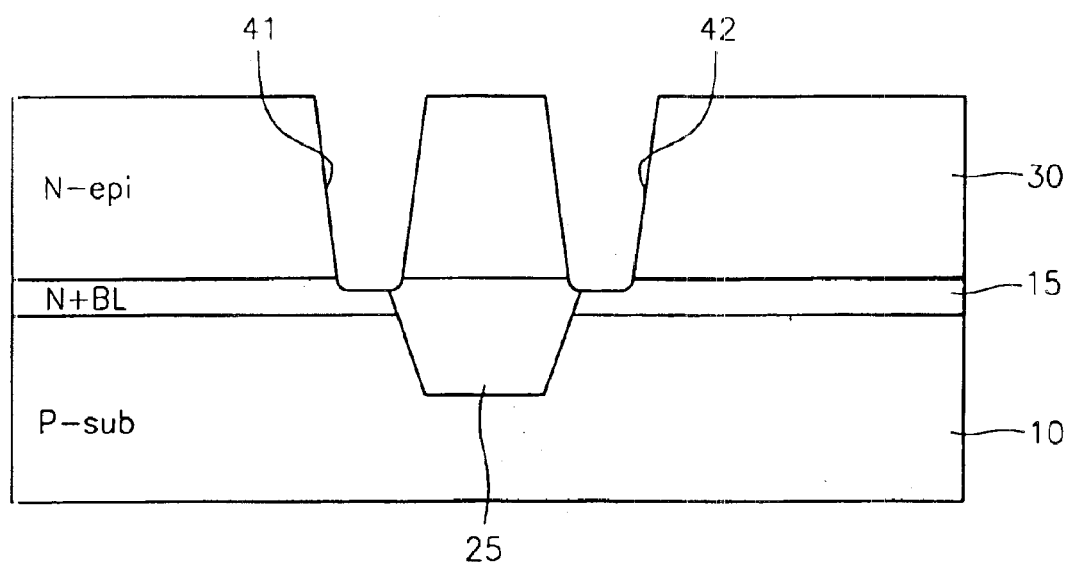

Referring to FIG. 2, an N-epitaxial layer (N-epi) 30 may be grown on the buried layer 15 and the isolation layer 25, and etched to a depth that reaches the buried layer 15, thereby forming drain trenches 41 and 42 over both sidewalls of the isolation layer 25. The epitaxial layer 30 may have an impurity concentration of about $10^{15}$ ions/cm$^3$, for example.

Figure 3:
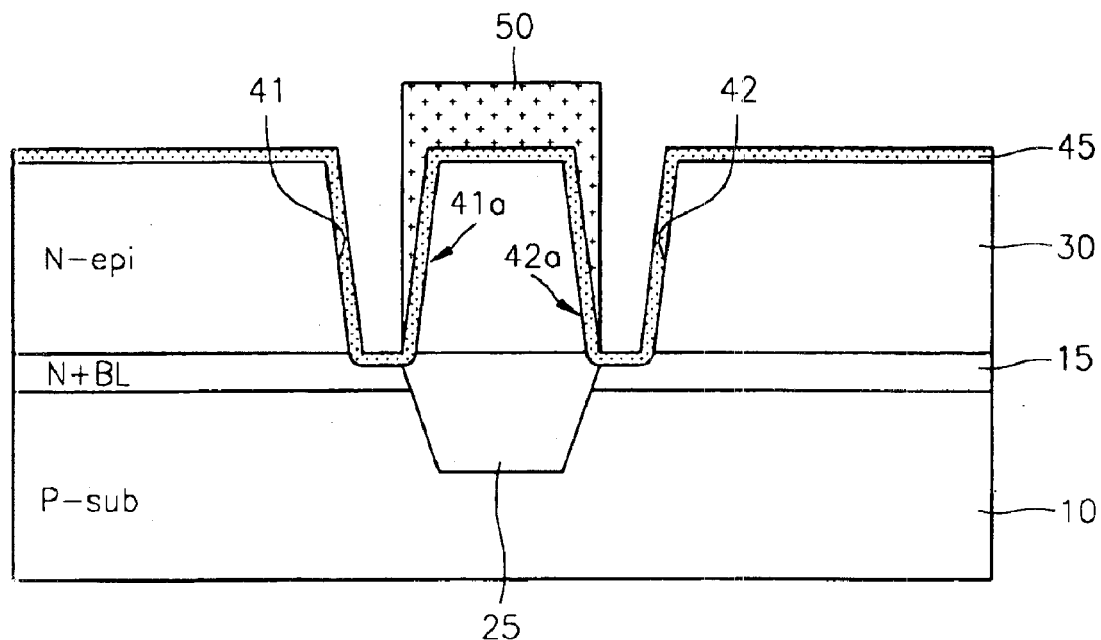

As shown in FIG. 3, a dielectric layer 45 may be deposited on the resultant structure shown in FIG. 2 in order to form dielectric spacers in the drain trenches 41 and 42, on sidewalls 41a and 42a above the isolation layer 25. The dielectric layer 45 may be deposited to a thickness that does not completely fill the drain trenches 41 and 42, and may be embodied as a silicon nitride layer or a silicon oxide layer, for example. A dielectric layer 45 of silicon nitride may be deposited using plasma-enhanced CVD (PECVD) in which SiH$_4$ and NH$_3$ may be used as source gases, and in which Ar and/or He may be used as a carrier gas, for example. Exemplary embodiments of the present invention are not limited to the above deposition process, however, as other known deposition processes may be substituted for PECVD.

A mask 50 may be formed to protect portions of the dielectric layer 45 that are formed on the sidewalls 41a and 42a. For example, a photoresist may coat a resultant structure on which the dielectric layer 45 is formed, and then may be exposed and developed to leave a patterned photoresist on only the portion of the dielectric layer 45 that is formed on sidewalls 41a and 42a.

Figure 4:
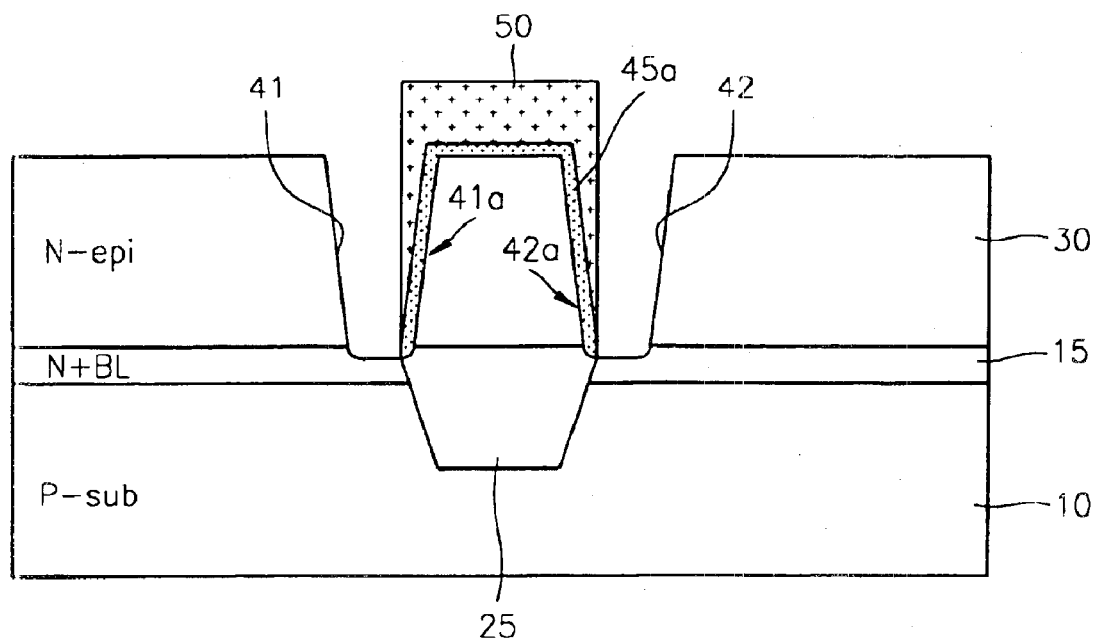

As shown in FIG. 4, a portion of the dielectric layer 45 not protected by the mask 50 may be etched back using CFx, CHxFy, or Hx as an etch gas, for example. Thus, the portion of the dielectric layer 45 protected by the mask 50 may remain to form a spacer 45a on the sidewalls 41a and 42a of drain trenches 41 and 42. The spacer 45a may cover a portion of a surface of the epitaxial layer 30 between drain trenches 41 and 42, as shown in FIG. 4.

Figure 5:
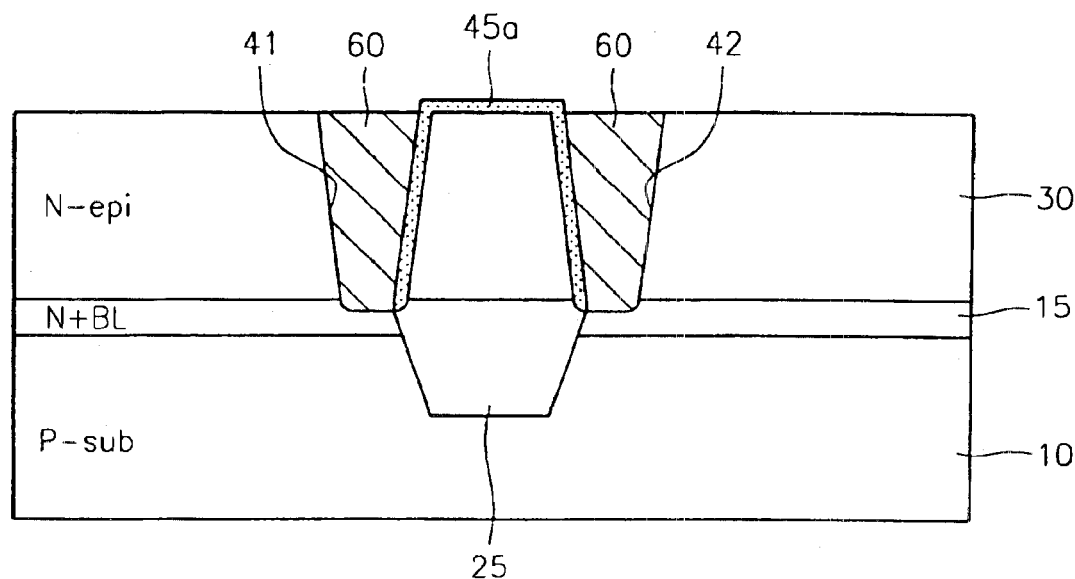

Referring to FIG. 5, the mask 50 may be removed to expose the spacer 45a, and then doped polysilicon may be deposited so as to cover the epitaxial layer 30, and so as to fill drain trenches 41 and 42. The doped polysilicon may be deposited at a temperature of 500° C.–700° C. using LPCVD, for example. The undoped polysilicon may be deposited and doped with arsenic (As) or phosphorus (P) using an ion implantation method, for example. Alternatively, undoped polysilicon may be doped with impurities in-situ and deposited using LPCVD, for example. In an exemplary embodiment, the doped polysilicon may contain impurity ions of $10^{14}$ ions/cm$^3$ or more. The impurity ions used in the doping may be one or more of As, P, B, In, Sb, etc. The impurity ions selected may depend on the conductivity type of a VDMOS transistor that is to be manufactured. In an exemplary embodiment, if an N-channel VDMOS transistor is to be manufactured, N-type impurity ions such as As, P, Sb, etc., may be used. Portions of the doped polysilicon covering the epitaxial layer 30 may be etched back so that the doped polysilicon remains only in the drain trenches 41 and 42. As a result, plug-type drains 60, which fill the drain trenches 41 and 42, may be formed in the epitaxial layer 30, as shown in FIG. 5.

Figure 6:
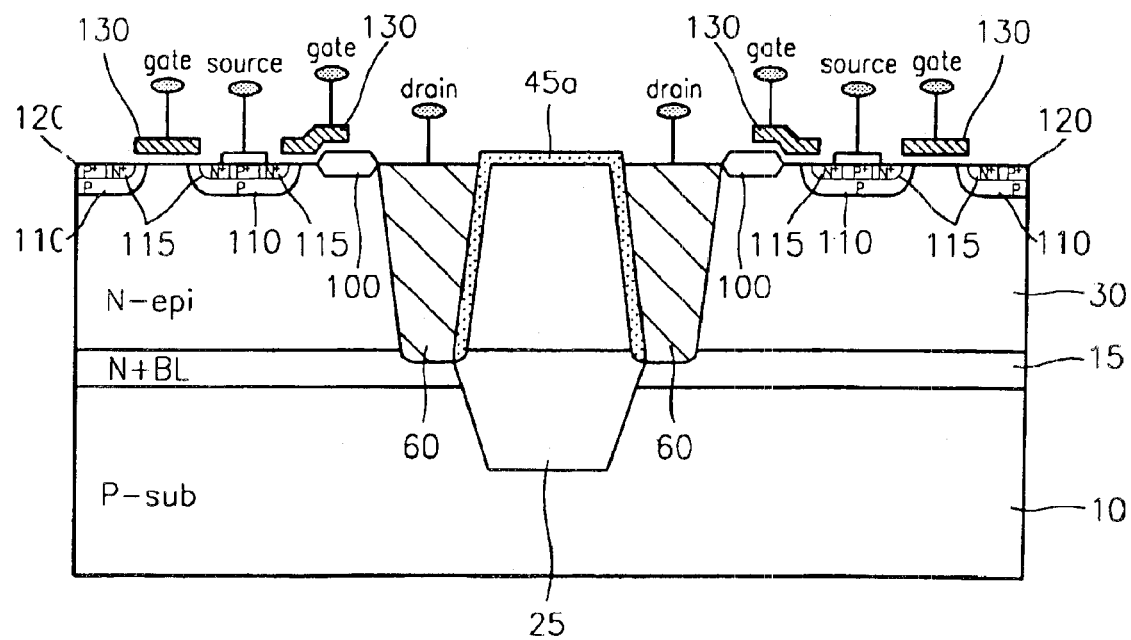

FIG. 6 illustrates gates and sources formed on the structure of FIG. 5. Local oxidation of silicon (LOCOS) layers 100 may be formed at a surface of the epitaxial layer 30, and then P-type body areas 110, having an impurity concentration of about $10^{18}$ ions/cm$^3$, for example, may be formed in specified portions of the epitaxial layer 30, such as the locations shown in FIG. 6, for example. The LOCOS layers 100, and thermal oxide layers (not shown) formed on and/or around the LOCOS layers 100 are used as gate oxide layers. Gates 130 may be formed on the thermal oxide layers. N+ source areas 115 having an impurity concentration of about $10^{19}$ ions/cm$^3$, and P+ channel areas 120 having an impurity concentration of about $10^{19}$ ions/cm$^3$ may be formed in the P-type body areas 110, by known processes. The gates 130 may be connected to gate electrodes (gate), the N+ source areas 115 and the P+ channel areas 120 may be connected to source electrodes (source), and the plug-type drains 60 may be connected to drain electrodes (drain), for example.

As described above, the drains 60 may be formed by burying a conductive material, instead of by implanting ions. Since the diffusion of impurity ions at junctions due to a subsequent thermal process can be reduced and/or eliminated, and desired heavy doping is possible, drain resistance may be reduced. If the drains 60 are formed of a conductive material having a low resistance, Rdson may be reduced to a desired level. Also, since the spacer 45a is formed near the isolation layer 25, isolation may be improved as compared to a transistor having only the isolation layer 25. Thus, even though the area of the isolation layer 25 is small, sound isolation effects may be possible. Therefore, area reduction of the isolation layer 25 may be advantageous in the production of high density semiconductor devices.

Referring to FIG. 6, a VDMOS transistor according to exemplary embodiments of the present invention may include a semiconductor substrate 10 containing impurity ions of a first conductivity type, i.e., P-type ions, and the buried layer 15 containing impurity ions of a second conductivity type, i.e., N-type ions. The buried layer 15 contains impurity ions of the second conductivity type at a specified first concentration (e.g., N-type impurity ions implanted at a concentration of about $10^{19}$ ions/cm$^3$).

The isolation layer 25 may be formed in the buried layer 15 and the semiconductor substrate 10. The epitaxial layer 30, containing impurity ions of the second conductivity type, but at a second concentration that is lower than the first concentration (e.g., N-type impurity ions implanted at a concentration of about $10^{15}$ ions/cm$^3$), may be formed on the isolation layer 25 and the buried layer 15.

The plug-type drains 60 may be formed of a conductive material (in this embodiment, doped polysilicon) to a depth reaching the buried layer 15, through epitaxial layer 30 and over both sidewalls of the isolation layer 25. A spacer 45a may be formed on outer walls of the drains 60 adjacent to the isolation layer 25, so as to help isolation among devices.

The body areas 110 containing impurity ions of the first conductivity type may be formed in the epitaxial layer 30. The source areas 115 containing impurity ions of the second conductivity type, and at a concentration substantially equal to the first concentration, may be formed in body areas 110. Channel areas 120 containing impurity ions of the first conductivity type (e.g., P-type impurity ions), and also substantially equal to the first concentration, may be included between the body areas 110 and the source areas 115. The LOCOS oxide layers 100 used as gate oxide layers may be formed beside the source areas 115 and higher in relation to the source areas 115, and the gates 130 may be formed over the source areas 115.

The gates 130 may be connected to gate electrodes (gate), the source areas 115 and the channel areas 120 may be connected to the source electrodes (source), and the drains 60 may be connected to the drain electrodes (drain). Channels may be formed on a surface of the channel areas 120, due to a voltage applied to the gates 130. Thus, a current flows from the drains 60 through buried layer 15, through the epitaxial layer 30 under the gates 130, and through the channels into the source areas 115.

As described above, the area of an isolation layer and Rdson can be reduced, and thus a packing density of a semiconductor device may be increased, providing a potential for improved semiconductor device (e.g., transistor) performance with reduced maintenance. Also, unit devices on the semiconductor device maybe more efficiently isolated.

Figure 7:
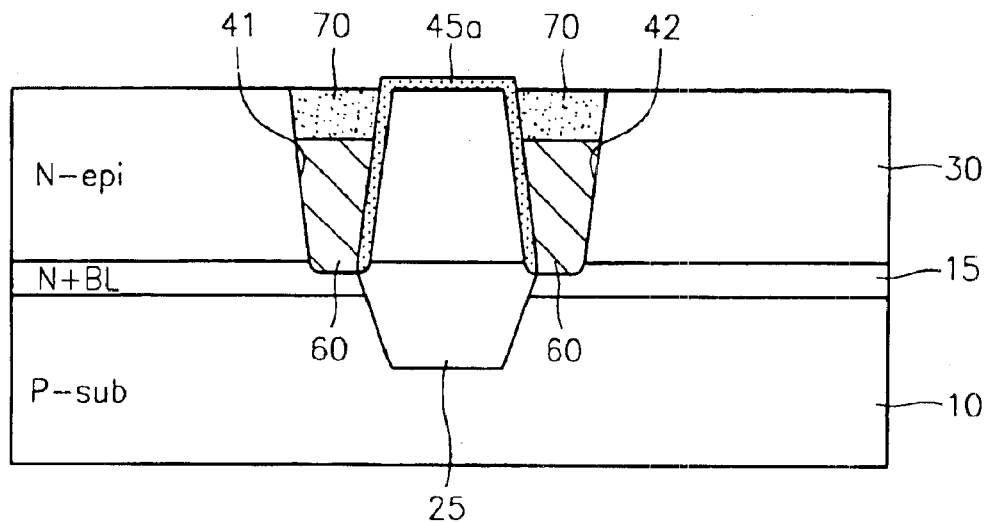
FIGS. 7 and 8 are cross-sectional views describing a method of manufacturing a VDMOS transistor according to another exemplary embodiment of the present invention.
Figure 8:
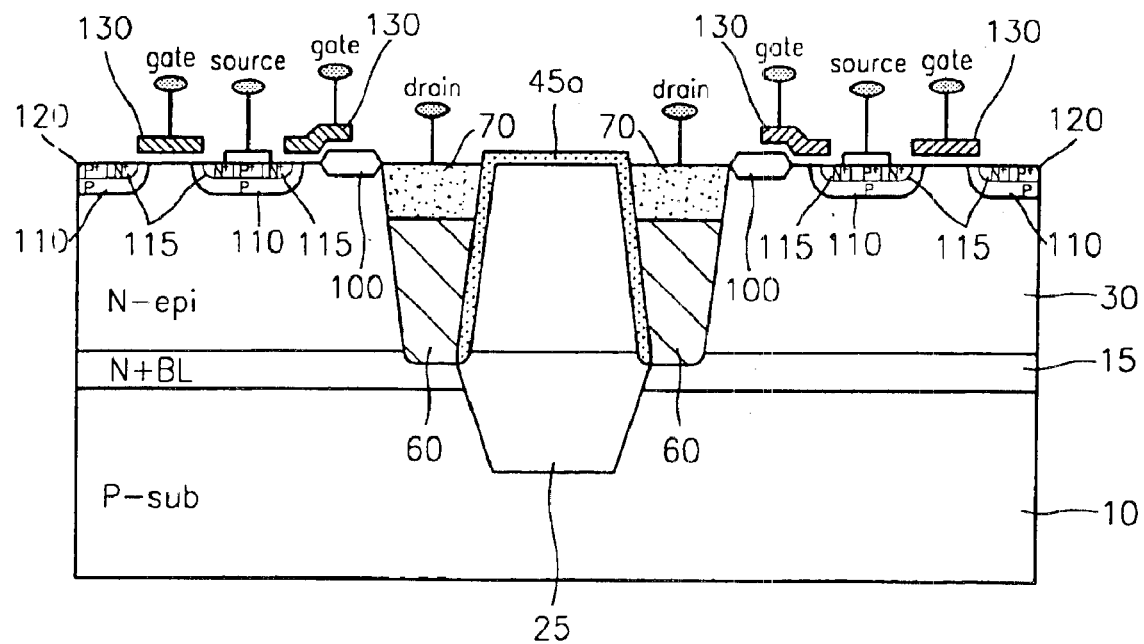

FIGS. 7 and 8 are cross-sectional views describing a method of manufacturing a VDMOS transistor according to another exemplary embodiment of the present invention.

In FIGS. 7 and 8, the same elements as those described in the previous exemplary embodiment denote the same reference numerals as those shown in FIGS. 1 through 6. Hereinafter, only steps that are different from steps described in the previous exemplary embodiments will be described.

Steps described with reference to FIGS. 1 through 5 in the previous exemplary embodiments are similar to those of this exemplary embodiment. In other words, doped polysilicon is deposited so as to cover the epitaxial layer 30 and completely fill the drain trenches 41 and 42 shown in FIG. 5.

As shown in FIG. 7, upper portions of the doped polysilicon may be additionally doped with POCl$_3$. Thus, the upper portions of the doped polysilicon in the drain trenches 41 and 42 become low resistive layers 70 in which sheet resistance may be reduced to a resistance value between about 5Ω/sq to 50Ω/sq. In the previous exemplary embodiments, the doped polysilicon may be a low resistive material which is doped with impurity ions to a concentration of $10^{14}$ ions/cm$^3$ or more. However, where the resistance is desired to be further reduced, e.g., based on certain device requirements, the process of doping phosphorus oxychloride (POCl$_3$) may be additionally performed. Thereafter, portions of the doped polysilicon remaining on the epitaxial layer 30 may be etched back. As a result, plug-type drains 60 having low resistive layers 70 doped with POCl₃ may be formed in drain trenches 41 and 42.

Referring to FIG. 8, gates and source areas may be formed on the resultant structure shown in FIG. 7. Detailed descriptions are the same as those explained with reference to FIG. 6, and thus will not be repeated here.

As described above, in this exemplary embodiment, doped polysilicon may be deposited and additionally doped with POCl₃ so as to form the drains 60. This may result in a marked reduction in Rdson.

In the exemplary embodiments of the present invention, a conductive material is buried in an epitaxial layer to form plug-type drains. The conductive material may be heavily-doped polysilicon or heavily-doped polysilicon additionally doped with POCl₃. Unlike the prior art, ion implantation and ion diffusion are not used or performed in order to form drains, and thus the diffusion of ions into junctions, due to a subsequent thermal process, can be reduced, while desired heavy doping may still be possible. Thus, Rdson may be more easily reduced, as compared to conventional processes, which may result in an increase in current through the device.

Also, since a dielectric spacer is additionally formed near or in the vicinity of an isolation layer, and although the formed isolation layer is smaller than an existing isolation layer of a conventional transistor, an improved isolation effect may be expected. As a result, reduction in the area of the isolation layer may enable scaled down semiconductor chips. Further as described in the above exemplary embodiments, resistance of the plug-type drains can be reduced to a desired level by using a conductive material having a low resistance. This too may be advantageous to the high integration of semiconductor devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A double-diffused metal oxide semiconductor (DMOS) transistor, comprising:

a semiconductor substrate which includes impurity ions of a first conductivity type;

a buried layer formed on the semiconductor substrate and including impurity ions of a second conductivity type;

an isolation layer formed in the buried layer and semiconductor substrate;

an epitaxial layer formed on the isolation layer and the buried layer and including impurity ions of the second conductivity type;

at least a pair of plug-type drains formed in the epitaxial layer and including impurity ions of the second conductivity type;

a dielectric spacer formed on outer sidewalls of the plug-type drains, adjacent to the isolation layer;

a plurality of body areas formed in the epitaxial layer and including impurity ions of the first conductivity type;

a plurality of source areas formed in the body areas and including impurity ions of the second conductivity type; and a plurality of gate oxide layers and gates formed on the source areas.

2. The DMOS transistor of claim 1, wherein the source areas comprise channel areas including impurity ions of the first conductivity type.

3. The DMOS transistor of claim 1, wherein the isolation layer is one of an oxide layer and an undoped polysilicon layer.

4. The DMOS transistor of claim 1, wherein the dielectric spacer is one of a silicon nitride layer and a silicon oxide layer.

5. The DMOS transistor of claim 1, wherein the plug-type drains are formed of a conductive material.

6. The DMOS transistor of claim 5, wherein the conductive material is doped polysilicon.

7. The DMOS transistor of claim 6, wherein upper portions of the doped polysilicon are additionally doped with phosphorus oxychloride (POCl₃).

8. The DMOS transistor of claim 6, wherein the doped polysilicon has an impurity concentration of at least $1\times10^{14}$ ions/cm³.

9. The DMOS of claim 7, wherein the doped polysilicon has an impurity concentration of at least $1\times10^{14}$ ions/cm³.

10. A semiconductor device, comprising:

a first layer on a semiconductor substrate;

an isolation trench in the first layer;

an isolation layer in the isolation trench;

a second layer on the first layer and isolation layer;

a pair of drain trenches in the second layer; and plug-type drains provided in said pair of drain trenches, said plug-type drains are separated from said isolation layer by a dielectric spacer.

* * * * *